(12) United States Patent
Chen (10) Patent No.: US 10,312,934 B2
(45) Date of Patent: Jun. 4, 2019

(54) CURRENT SOURCE AND DIGITAL TO ANALOG CONVERTER

(71) Applicants: Semiconductor Manufacturing International (Beijing) Corporation, Beijing (CN); Semiconductor Manufacturing International (Shanghai) Corporation, Shanghai (CN)

(72) Inventor: Chunpeng Chen, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/817,830

(22) Filed: Nov. 20, 2017

(65) Prior Publication Data
US 2018/0145699 A1    May 24, 2018

(30) Foreign Application Priority Data
Nov. 23, 2016    (CN) .......................... 2016 1 1046392

(51) Int. Cl.
*H03M 1/00* (2006.01)
*H03M 1/74* (2006.01)
(Continued)

(52) U.S. Cl.
CPC .............. *H03M 1/742* (2013.01); *G05F 3/24* (2013.01); *G05F 3/262* (2013.01)

(58) Field of Classification Search
CPC ...... H03M 1/745; H03M 1/742; H03M 1/747; H03M 1/0863; H03M 3/502; H03M 1/687;
(Continued)

(56) References Cited

U.S. PATENT DOCUMENTS 5,638,011 A * 6/1997 Nguyen ........... H03K 17/04106
327/108
5,990,711 A * 11/1999 Sekimoto ........... H03K 17/6871
323/316
(Continued)

OTHER PUBLICATIONS

[Communication] Extended Search Report for EP Patent Application No. 17202697.3 dated Apr. 20, 2018 (11 pp).

*Primary Examiner* — Linh V Nguyen
(74) *Attorney, Agent, or Firm* — Brinks Gilson & Lione (57) ABSTRACT

The present disclosure relates to the technical field of semiconductors, and discloses a current source and a digital to analog convertor. The current source includes a current output circuit and an impedance gain circuit which is configured to increase output impedance of the current output circuit. The current output circuit includes a first PMOS transistor and a second PMOS transistor. The impedance gain circuit includes a first end, a second end, a third end which is connected to a supply voltage, and a fourth end which is connected to the ground. A source electrode of the first PMOS transistor is connected to the supply voltage, a drain electrode of the first PMOS transistor is connected to a source electrode of the second PMOS transistor and the first end of the impedance gain circuit, and a gate electrode of the first PMOS transistor is controlled by a first bias voltage. A gate electrode of the second PMOS transistor is connected to the second end of the impedance gain circuit, and a drain electrode of the second PMOS transistor serves as an output end of the current source.

8 Claims, 8 Drawing Sheets

(51) Int. Cl.
*G05F 3/24* (2006.01)
*G05F 3/26* (2006.01)

(58) Field of Classification Search
CPC ............ H03M 1/0604; H03M 1/0682; H03M 1/1057; H03M 1/664; H03M 1/0651; H03M 1/66
USPC .................. 341/118, 136, 144, 120, 135
See application file for complete search history.

(56) References Cited

U.S. PATENT DOCUMENTS

| | | | |
|---|---|---|---|
| 6,124,705 A | 9/2000 | Kwong | |
| 7,345,605 B2* | 3/2008 | Jaussi | H03M 5/20 341/143 |
| 2005/0052298 A1* | 3/2005 | Moon | H03M 1/687 341/135 |
| 2007/0046378 A1* | 3/2007 | Baum | H03F 3/3028 330/311 |
| 2009/0201186 A1* | 8/2009 | Huang | H03M 1/0602 341/144 |
| 2010/0182180 A1* | 7/2010 | Ikoma | H03M 1/0604 341/144 |
| 2010/0259317 A1* | 10/2010 | Lu | G05F 3/262 327/543 |
| 2013/0120177 A1* | 5/2013 | Keramat | G05F 3/262 341/144 |

* cited by examiner

CURRENT SOURCE AND DIGITAL TO ANALOG CONVERTER

RELATED APPLICATION

The present application claims priority to Chinese Patent Application No. 201611046392.0, filed Nov. 23, 2016, the entirety of which is hereby incorporated by reference.

BACKGROUND

Technical Field

The present disclosure relates to the technical field of semiconductors, and particularly to a current source and a digital to analog convertor.

Related Art

A digital to analog convertor (Digital to Analog Convertor, DAC) is a bridge between the world of digits and the world of analog. With the rapid development of the digital times, DAC is widely applied to various fields, such as, the aerospace field and the field of digital players. With the constant pursuit of customers for product quality, the customers also have higher requirements for DAC. Therefore, to ensure the quality of digital products, a DAC of high speed, high precision, and high linearity is required.

A high-speed DAC has a current output of dozens of milliampere, and may generate a much greater output voltage, for example, 0.7V and 1.3V. Therefore, DAC is widely applied to the field of video decoding. Currently, the high-speed DAC uses a current steering (current steering) structure.

Output impedance of an ideal current source is infinite, and current generated thereby would not become smaller as an output voltage increases; however, current generated by a non-ideal current source becomes smaller as the output voltage increases. This causes output linearity of the DAC to become worse, so as to affect quality of a video signal.

SUMMARY

An object of the present disclosure is providing a current source, so as to be able to provide greater output impedance.

In one embodiment of the present disclosure, a current source is provided. The current source includes: a current output circuit and an impedance gain circuit which is configured to increase output impedance of the current output circuit. The current output circuit includes: a first PMOS transistor and a second PMOS transistor. The impedance gain circuit includes a first end, a second end, a third end which is connected to a supply voltage, and a fourth end which is connected to the ground. A source electrode of the first PMOS transistor is connected to the supply voltage, a drain electrode of the first PMOS transistor is connected to a source electrode of the second PMOS transistor and the first end of the impedance gain circuit, and a gate electrode of the first PMOS transistor is controlled by a first bias voltage. A gate electrode of the second PMOS transistor is connected to the second end of the impedance gain circuit, and a drain electrode of the second PMOS transistor serves as an output end of the current source.

In some forms, the impedance gain circuit includes: a third PMOS transistor; a fourth PMOS transistor; and a pull-up electric potential module, where a gate electrode of the third PMOS transistor is connected to the first end of the impedance gain circuit, a source electrode of the third PMOS transistor is connected to the third end of the impedance gain circuit, and a drain electrode of the third PMOS transistor is connected to a source electrode of the fourth PMOS transistor; a drain electrode of the fourth PMOS transistor is connected to the second end of the impedance gain circuit, and a gate electrode of the fourth PMOS transistor is controlled by a second bias voltage; and one end of the pull-up electric potential module is connected to the second end of the impedance gain circuit, and another end of the pull-up electric potential module is connected to the fourth end of the impedance gain circuit.

In some forms, the impedance gain circuit includes: a third PMOS transistor; a fourth PMOS transistor; several PMOS transistors which are connected in series; and a pull-up electric potential module, where a gate electrode of the third PMOS transistor is connected to the first end of the impedance gain circuit, a source electrode of the third PMOS transistor is connected to the third end of the impedance gain circuit, and a drain electrode of the third PMOS transistor is connected to a source electrode of the fourth PMOS transistor by using the several PMOS transistors which are connected in series; a drain electrode of the fourth PMOS transistor is connected to the second end of the impedance gain circuit, and a gate electrode of the fourth PMOS transistor is controlled by a second bias voltage; and one end of the pull-up electric potential module is connected to the second end of the impedance gain circuit, and another end of the pull-up electric potential module is connected to the fourth end of the impedance gain circuit.

In some forms, the first PMOS transistor, the second PMOS transistor, the third PMOS transistor, and the fourth PMOS transistor operate in a saturation region.

In some forms, the pull-up electric potential module includes a resistor or an MOS transistor.

In some forms, the MOS transistor includes a NMOS transistor, a drain electrode of the NMOS transistor is connected to the second end of the impedance gain circuit, and a source electrode of the NMOS transistor is connected to the fourth end of the impedance gain circuit.

In some forms, the MOS transistor includes a PMOS transistor, a source electrode of the PMOS transistor is connected to the second end of the impedance gain circuit, and a drain electrode of the PMOS transistor is connected to the fourth end of the impedance gain circuit.

In another embodiment of the present disclosure, a digital to analog convertor is provided. The digital to analog convertor includes: a plurality of current sources according to any one of the foregoing embodiments.

In some forms, the digital to analog convertor further includes: a first switch and a second switch connected to an output end of the current source, where one of the first switch or the second switch is turned on, and the other switch of the first switch or the second switch is turned off.

In some forms, the first switch and the second switch include PMOS transistors.

On the basis of the current steering structure of a conventional DAC, embodiments of the present disclosure increase output impedance of a current source by adding impedance gain circuits, so as to weaken non-ideality of the current source. Therefore, output linearity of the DAC may be improved when the current source is applied to DAC, thereby being able to improve quality of a video signal.

According to the following detailed descriptions of the embodiments for illustration purposes of the present disclosure with reference to the accompanying drawings, other characters, aspects, and advantages of the present invention become clear.

BRIEF DESCRIPTION OF THE DRAWINGS

The accompanying drawings form a part of the specification, describe embodiments and implementations for illustration purposes of the present disclosure, and are used to explain the principles of the present disclosure together with the specification. In the accompanying drawings.

DETAILED DESCRIPTION

Embodiments and implementations are described for illustration purposes in detail with reference to the accompanying drawings. It should be understood that unless being described in detail, relative layouts, mathematical expressions, and numeric values of components and steps described in these embodiments should not be understood as a limitation to the scope of the present disclosure.

In addition, it should be understood that for ease of description, sizes of the parts shown in the accompanying drawings are not necessarily drawn according to an actual proportional relationship. For example, thicknesses or widths of some layers may be magnified with respect to other layers.

The following description about the embodiments is only for illustrative purposes, and should not be used as any limitation on the present disclosure and applications or uses of the present disclosure in any sense.

Technologies, methods, and devices that are known by a person of ordinary skill in the related fields may not be discussed in detail. However, in cases in which the technologies, methods, and devices are applicable, the technologies, methods, and devices should be considered as a part of the description.

It should be noted that similar reference signs and letters represent similar items in the following accompanying drawings. Therefore, once an item is defined or described in a figure, the item needs not to be further discussed in the description of the subsequent figures.

A parameter measuring DAC output linearity is Integral Non-Linearity (INL). Smaller INL indicates better DAC output linearity. A relationship between the Integral Non-Linearity (INL) of a DAC and an output impedance $R_{out}$ of a current source is: $INL = a \times I_{MSB} \times R_L \times R_L \times N \times N/(4 \times R_{out})$, where $a \times I_{MSB} = I_{LSB}$ is a unit current source, a is a coefficient and often is 1 part in a power of 2, $R_L$ is an output load impedance, and N is the number of current sources. It can be known from the foregoing formula that if the output impedance $R_{out}$ of the current source is greater, the INL is smaller, that is, the DAC output linearity is better.

On the basis of the current steering structure of a conventional DAC, the present disclosure increases output impedance of a current source by adding gain stages, so as to weaken non-ideality of the current source. Therefore, output linearity of the DAC may be improved when the current source is applied to a DAC, thereby being able to improve quality of a video signal.

Figure 1:
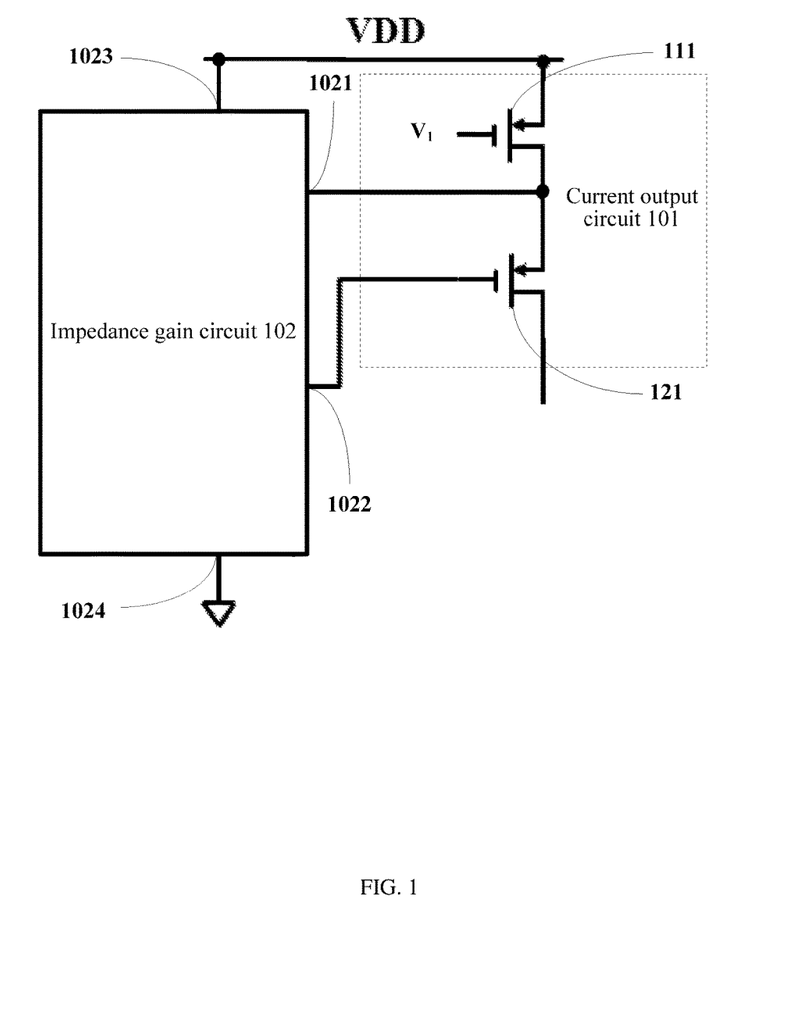
FIG. 1 is a schematic structural diagram of a current source according to an embodiment of the present disclosure.

FIG. 1 is a schematic structural diagram of a current source according to an embodiment of the present disclosure. As shown in FIG. 1, the current source may include a current output circuit 101 and an impedance gain circuit 102. The current output circuit 101 may include a first PMOS transistor 111 and a second PMOS transistor 121. The impedance gain circuit 102 is used to increase output impedance of the current output circuit 101, and may include a first end 1021, a second end 1022, a third end 1023 which is connected to a supply voltage VDD, and a fourth end 1024 which is connected to the ground. A source electrode of the first PMOS transistor 111 is connected to the supply voltage VDD, a drain electrode of the first PMOS transistor 111 is connected to a source electrode of the second PMOS transistor 121 and the first end 1021, and a gate electrode of the first PMOS transistor 111 is controlled by a first bias voltage $V_1$. A gate electrode of the second PMOS transistor 121 is connected to the second end 1022, and a drain electrode of the second PMOS transistor 121 serves as an output end of the current source.

In some forms, both the first PMOS transistor 111 and the second PMOS transistor 121 operate in a saturation region. The first bias voltage $V_1$ may enable the first PMOS transistor 111 to operate in the saturation region. Voltage of the second end 1022 may enable the second PMOS transistor 121 to operate in the saturation region.

The current source of this embodiment adds impedance gain circuits so as to be able to increase output impedance of a current output circuit. That is, output impedance of the current source is increased. Therefore, output linearity of the DAC may be improved when the current source is applied to DAC, thereby being able to improve quality of a video signal.

Figure 2:
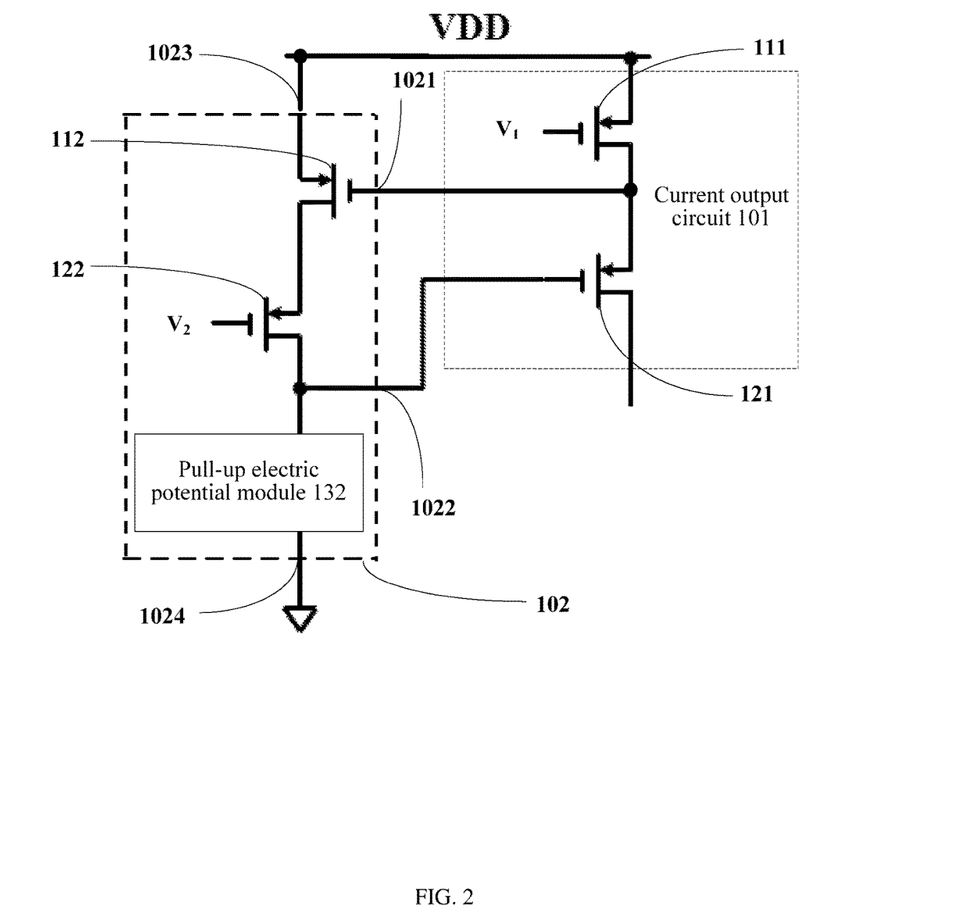
FIG. 2 is a schematic structural diagram of a current source according to another embodiment of the present disclosure.

FIG. 2 is a schematic structural diagram of a current source according to another embodiment of the present disclosure. As shown in FIG. 2, in this embodiment, the impedance gain circuit 102 may include a third PMOS transistor 112, a fourth PMOS transistor 122, and a pull-up electric potential module 132. A gate electrode of the third PMOS transistor 112 is connected to the first end 1021, a source electrode of the third PMOS transistor 112 is connected to the third end 1023, and a drain electrode of the third PMOS transistor 112 is connected to a source electrode of the fourth PMOS transistor 122. A drain electrode of the fourth PMOS transistor 122 is connected to the second end 1022, and a gate electrode of the fourth PMOS transistor 122 is controlled by a second bias voltage $V_2$. One end of the pull-up electric potential module 132 is connected to the second end 1022, and another end of the pull-up electric potential module 132 is connected to the fourth end 1024. The pull-up electric potential module 132 is used to pull up electric potential of the second end 1022.

In some forms, the first PMOS transistor 111, the second PMOS transistor 121, the third PMOS transistor 112, and the fourth PMOS transistor 122 all operate in a saturation region.

In the following, changes of the output impedance of the current source are analyzed according to this embodiment.

An existing current source is composed of two PMOS tubes, that is, the foregoing current output circuit 101. According to the small-signal theory, output impedance of the existing current source is about $R_{out}=g_m2 \times r_o2 \times r_o1$, where $g_m2$ and $r_o2$ respectively are transconductance and output impedance of the second PMOS transistor 121, and $r_o1$ is output impedance of the first PMOS transistor 111.

According to the small-signal theory, a gain provided by the impedance gain circuit 102 is about $A_v=g_m3 \times ((g_m4 \times r_o4 \times r_o3) \| r_o5)$, where $g_m3$ and $r_o3$ respectively are transconductance and output impedance of the third PMOS transistor 112, $g_m4$ and $r_o4$ respectively are transconductance and output impedance of the fourth PMOS transistor 122, and $r_o5$ is output impedance of the pull-up electric potential module 132.

Because $g_m4 \times r_o4 \times r_o3$ is greatly larger than $r_o5$, $A_v$ may approximately be $A_v=g_m3 \times r_o5$. Therefore, the output impedance of the current source which is provided in this embodiment may approximately be $R_{out}=A_v \times g_m2 \times r_o2 \times r_o1 = g_m3 \times r_o5 \times g_m2 \times r_o2 \times r_o1$. In view of the above, this embodiment improves the output impedance of the current source.

Figure 3:
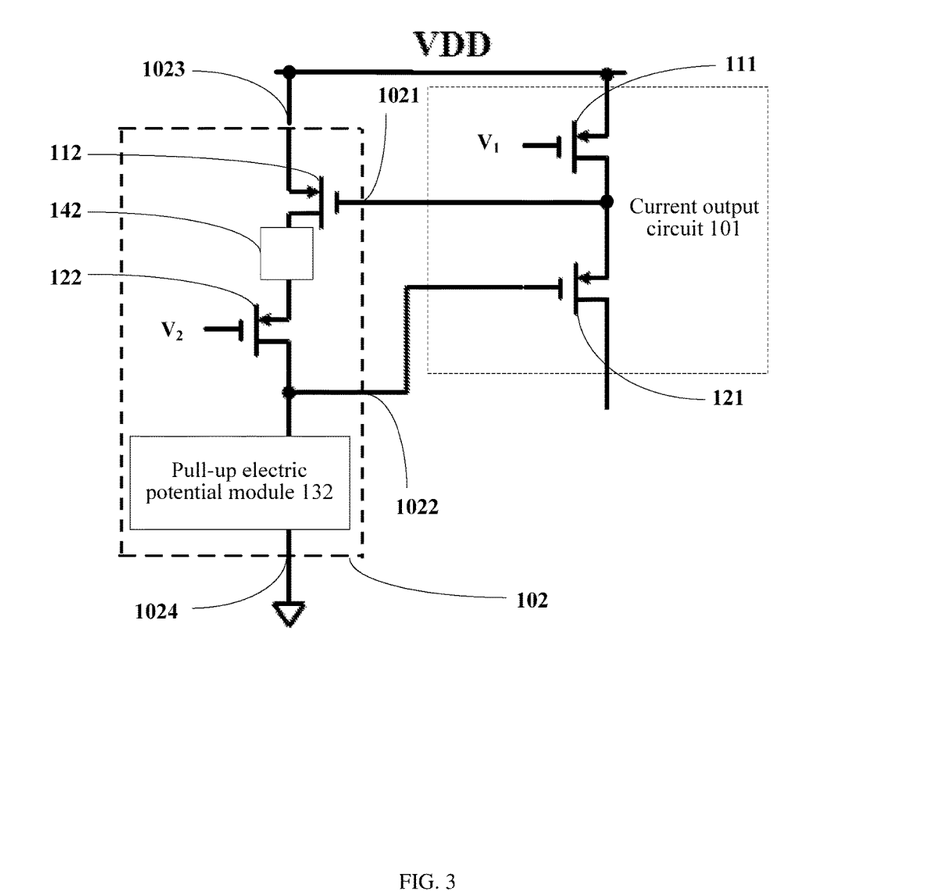
FIG. 3 is a schematic structural diagram of a current source according to yet another embodiment of the present disclosure.

FIG. 3 is a schematic structural diagram of a current source according to yet another embodiment of the present disclosure. It should be noted that this embodiment merely introduces differences from the embodiments shown in FIG. 2, and for the other similarities, reference may be made to the description of the embodiments shown in FIG. 2. Compared with the embodiments shown in FIG. 2, the impedance gain circuit 102 in the current source shown in FIG. 3 includes a third PMOS transistor 112, a fourth PMOS transistor 122, and a pull-up electric potential module 132, and may further include several PMOS transistors 142 which are connected in series and are provided between the third PMOS transistor 112 and the fourth PMOS transistor 122. That is, a drain electrode of the third PMOS transistor 112 is connected to a source electrode of the fourth PMOS transistor 122 by using the several PMOS transistors 142 which are connected in series.

It should be noted that "PMOS transistors which are connected in series" indicates that transmission terminals of the PMOS transistors are commented in series. That is, a drain electrode of a PMOS transistor is connected to a source electrode of a next PMOS transistor, the source electrode of the next PMOS transistor is connected to a drain electrode of a further next PMOS transistor, and so forth.

It should be understood that the impedance gain circuit 102 is not limited to the specific structure shown in FIG. 2 or FIG. 3, as long as an internal circuit of the impedance gain circuit 102 may improve the output impedance of a current output circuit.

In addition, the pull-up electric potential module 132 shown in FIG. 2 and FIG. 3 may include a resistor or an MOS transistor.

In an implementation manner, the MOS transistor may include a NMOS transistor. In such a case, a drain electrode of the NMOS transistor is connected to the second end 1022, and a source electrode of the NMOS transistor is connected to the fourth end 1024.

In another implementation manner, the MOS transistor may include a PMOS transistor. In such a case, a source electrode of the PMOS transistor is connected to the second end 1022, and a drain electrode of the PMOS transistor is connected to the fourth end 1024.

The current source provided in the present disclosure may be configured to be, but is not limited to be, a digital to analog convertor. In some forms, the digital to analog convertor may include a plurality of current sources according to any one of the foregoing embodiments.

Figure 4:
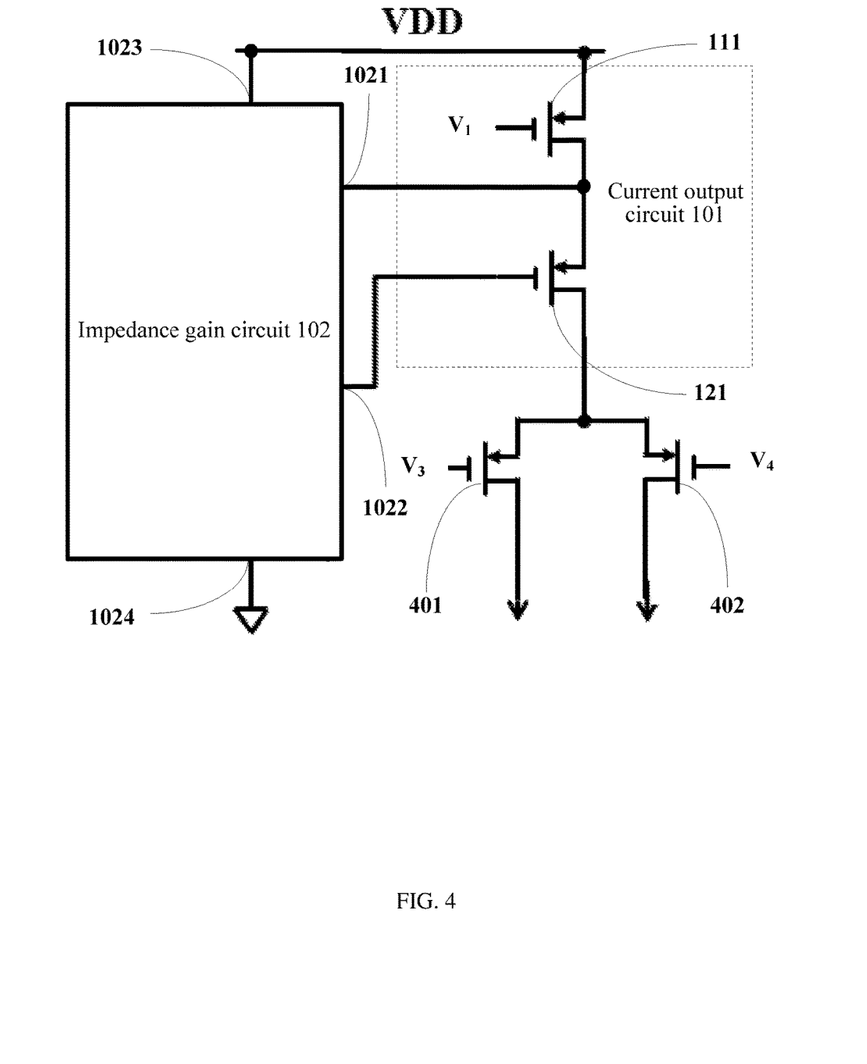
FIG. 4 is a schematic structural diagram of a digital to analog convertor according to an embodiment of the present disclosure.

FIG. 4 is a schematic structural diagram of a digital to analog convertor according to an embodiment of the present disclosure. As shown in FIG. 4, the digital to analog convertor may include the current source according to any one of the foregoing embodiments (FIG. 4 uses the current source shown in FIG. 1 as an example), and a first switch 401 and a second switch 402 connected to an output end of the current source. Herein, one of the first switch 401 and the second switch 402 is turned on, and the other one is turned off. For example, when the first switch 401 is turned on, the second switch 402 is turned off; and when the first switch 401 is turned off, the second switch 402 is turned on.

In an implementation manner, the first switch 401 and the second switch 402 may include PMOS transistors. The first switch 401 and the second switch 402 are controlled by a third bias voltage V3 and a fourth bias voltage V4, respectively. By adjusting sizes of the third bias voltage V3 and the fourth bias voltage V4, one of the first switch 401 and the second switch 402 may be turned on, and the other one is turned off. However, it should be understood that functions of the first switch 401 and the second switch 402 may also be achieved by using other devices.

Figure 5A:
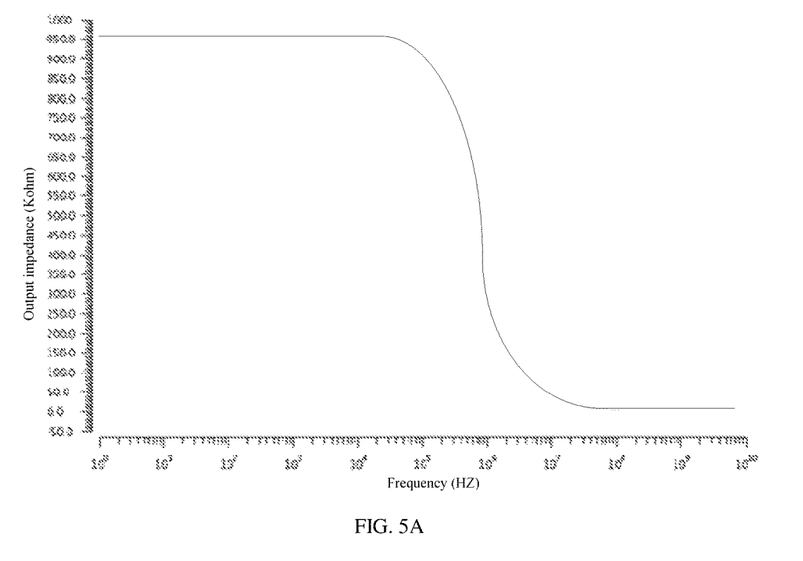
FIG. 5A and FIG. 5B respectively show simulation results about an output impedance of current sources in the prior art and according to an embodiment of the present disclosure changing with a frequency.
Figure 5B:
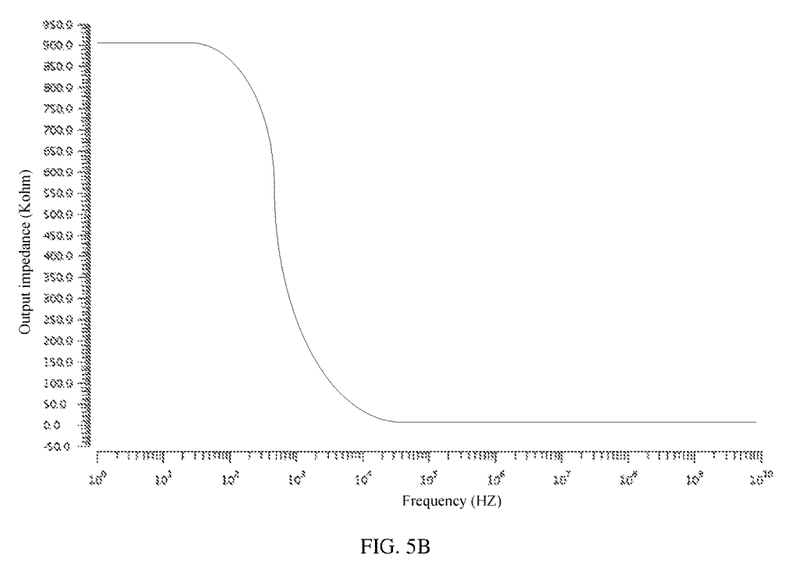

FIG. 5A and FIG. 5B respectively show simulation results about output impedance of current sources in the prior art and according to an embodiment of the present disclosure changing with a frequency. As shown in FIG. 5A and FIG. 5B, output impedance of a current source is added to be about 905.9 Mohm in FIG. 5B from being 955.7 Kohm in FIG. 5A. In view of the above, the output impedance of the current source provided in the present invention is greater, and is increased by approximately 1000 times that the output impedance of the current source in the prior art.

Figure 6A:
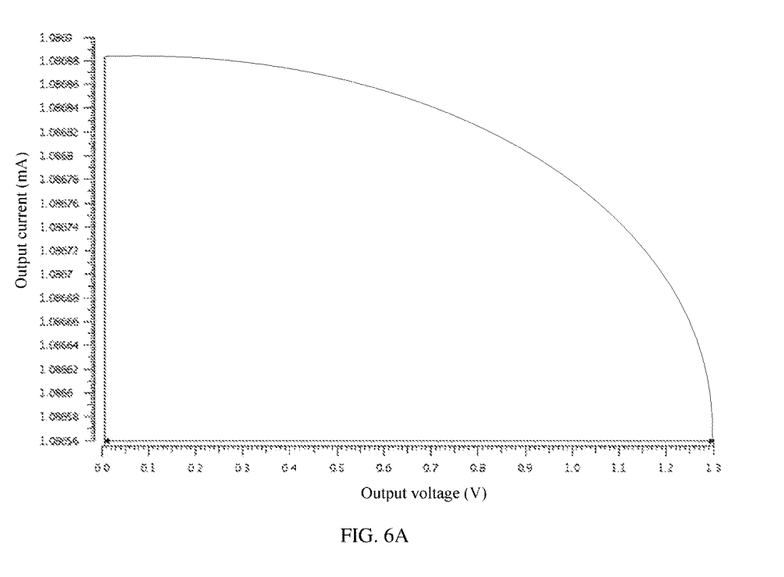
FIG. 6A and FIG. 6B respectively show simulation results about an output current of current sources in the prior art and according to an embodiment of the present disclosure changing as an output voltage increases.
Figure 6B:
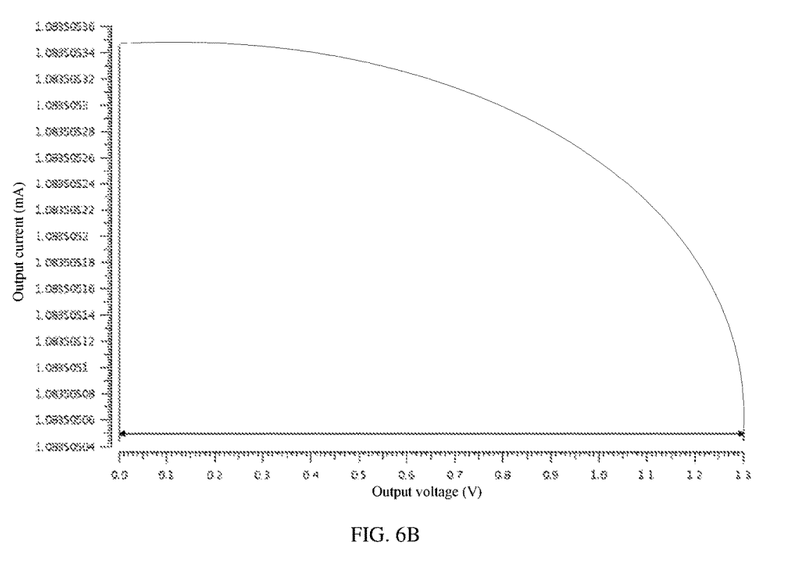

FIG. 6A and FIG. 6B respectively show simulation results about output current of current sources in the prior art and according to an embodiment of the present disclosure changing as an output voltage increases. As shown in FIG. 6A and FIG. 6B, variation range of the output current of a current source is decreased from about 317.6 nA in FIG. 6A to about 0.29 nA in FIG. 6B. In view of the above, the output current of the current source provided in the present disclosure is more stable, and the variation range of the output current is decreased to be about one thousandth of the prior art, i.e., being closer to the ideal current source.

Above, a current source and a digital to analog convertor according to the embodiments of the present disclosure are described in detail. In describing implementations of the present disclosure, some details generally known in the art are not described. According to the foregoing description, a person skilled in the art may completely understand how to implement the technical solutions disclosed herein. In addition, the embodiments according to the teaching disclosed in the specification may be freely combined. A person skilled in the art should understand that various amendments can be made to the embodiments described above without departing from the scope and the spirit of the present disclosure which are defined by the appended claims.

What is claimed is:

1. A current source, comprising:
   a current output circuit, comprising:
     a first PMOS transistor; and a second PMOS transistor;
an impedance gain circuit, configured to increase output impedance of the current output circuit, the impedance gain circuit comprising:
a first end;
a second end;
a third end which is connected to a supply voltage;
a fourth end which is connected to a ground;
a third PMOS transistor;
a fourth PMOS transistor;
several PMOS transistors which are connected in series; and
a pull-up electric potential module;
wherein a source electrode of the first PMOS transistor is connected to the supply voltage, a drain electrode of the first PMOS transistor is connected to a source electrode of the second PMOS transistor and the first end of the impedance gain circuit, and a gate electrode of the first PMOS transistor is controlled by a first bias voltage;
wherein a gate electrode of the second PMOS transistor is connected to the second end of the impedance gain circuit, and a drain electrode of the second PMOS transistor serves as an output end of the current source;
wherein a gate electrode of the third PMOS transistor is connected to the first end of the impedance gain circuit, a source electrode of the third PMOS transistor is connected to the third end of the impedance gain circuit, and a drain electrode of the third PMOS transistor is connected to a source electrode of the fourth PMOS transistor by using the several PMOS transistors which are connected in series;
wherein a drain electrode of the fourth PMOS transistor is connected to the second end of the impedance gain circuit, and a gate electrode of the fourth PMOS transistor is controlled by a second bias voltage; and
wherein one end of the pull-up electric potential module is connected to the second end of the impedance gain circuit, and another end of the pull-up electric potential module is connected to the fourth end of the impedance gain circuit.

2. The current source of claim 1, wherein the first PMOS transistor, the second PMOS transistor, the third PMOS transistor, and the fourth PMOS transistor operate in a saturation region.

3. The current source of claim 1, wherein the pull-up electric potential module comprises a resistor or an MOS transistor.

4. The current source of claim 3, wherein the MOS transistor comprises a NMOS transistor, a drain electrode of the NMOS transistor is connected to the second end of the impedance gain circuit, and a source electrode of the NMOS transistor is connected to the fourth end of the impedance gain circuit.

5. The current source of claim 3, wherein the MOS transistor comprises a PMOS transistor, a source electrode of the PMOS transistor is connected to the second end of the impedance gain circuit, and a drain electrode of the PMOS transistor is connected to the fourth end of the impedance gain circuit.

6. A digital to analog convertor, comprising: a plurality of current sources according to claim 1.

7. The digital to analog convertor according to claim 6, further comprising:
a first switch and a second switch connected to an output end of the current source, wherein one switch of the first switch or the second switch is turned on, and the other switch of the first switch or the second switch is turned off.

8. The digital to analog convertor of claim 7, wherein the first switch and the second switch comprise PMOS transistors.

* * * * *